(12) United States Patent
Vats et al.

(10) Patent No.: US 8,555,232 B2
(45) Date of Patent: Oct. 8, 2013

(54) WIRE ROUTING USING VIRTUAL LANDING PADS

(75) Inventors: Suparn Vats, Fremont, CA (US); Gaurav Shrivastav, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/036,308

(22) Filed: Feb. 28, 2011

(65) Prior Publication Data

US 2012/0221994 A1    Aug. 30, 2012

(51) Int. Cl.
*G06F 17/50* (2006.01)

(52) U.S. Cl.
USPC ............ 716/126; 716/110; 716/130; 716/132

(58) Field of Classification Search
USPC .......................................... 716/126
See application file for complete search history.

(56) References Cited

U.S. PATENT DOCUMENTS

| | | | |
|---|---|---|---|
| 5,208,170 A | 5/1993 | Kobeda et al. | |
| 5,514,622 A | 5/1996 | Bornstein et al. | |
| 5,674,781 A | 10/1997 | Huang et al. | |
| 6,525,382 B1 | 2/2003 | Ishida | |
| 6,651,236 B2* | 11/2003 | Ichimiya et al. | 257/203 |
| 7,257,797 B1* | 8/2007 | Waller et al. | 716/122 |
| 7,656,693 B2 | 2/2010 | Nakamura et al. | |
| 7,838,999 B1 | 11/2010 | Singh et al. | |
| 2003/0135837 A1* | 7/2003 | Okabe | 716/12 |
| 2007/0061770 A1* | 3/2007 | Kobayashi | 716/13 |
| 2008/0301616 A1* | 12/2008 | Krauch et al. | 716/12 |

* cited by examiner

*Primary Examiner* — Vuthe Siek
*Assistant Examiner* — Eric Lee
(74) *Attorney, Agent, or Firm* — Lawrence J. Merkel; Meyertons, Hood, Kivlin, Kowert & Goetzel, P.C.

(57) ABSTRACT

Systems and methods for wire routing using virtual landing pads (VLPs) are described. In an embodiment, a method includes routing a wiring path between an output of a first circuit component and a VLP that represents an input of a second circuit component. For example, the VLP may have an area larger than the area of a physical pin of the second circuit component. The method may also include identifying a connection point on the VLP that is separated from an actual terminal of the second circuit, and completing the path between the connection point and the actual terminal. In some embodiments, the output of the first circuit component may also be represented by its own VLP. As such, systems and methods described herein may allow a circuit designer to perform routing procedures in a complex, highly integrated circuit, while reducing the circuit's overall capacitance and associated power consumption.

20 Claims, 7 Drawing Sheets

WIRE ROUTING USING VIRTUAL LANDING PADS

BACKGROUND

1. Field of the Invention

This disclosure is related to the field of integrated circuit design, and more particularly to systems and methods for wire routing.

2. Description of the Related Art

Physical design is a basic step in the creation of integrated circuits. During physical design, schematic representations of a circuit's various components (e.g., transistors, logic gates, logic cells, macros, etc.) are converted into geometric shapes that will later allow manufacturing of the circuit. During this process, once the various geometric shapes are placed on specific locations in the circuit, a "wire routing" technique is used to connect components to each other in a manner that ensures the proper functioning of the circuit.

Due to the high levels of integration and miniaturization present in the modern electronic chip, however, finding suitable ways to connect its various cells or components can be an incredibly complex task. As a result, wire routing operations may require that such cells and components have their physical pins, terminals, connectors, or ports (which would otherwise be relatively small in size) designed as larger or "expanded" "landing pads." By using wider and/or longer landing pads, a wire router has more flexibility to make the specified connections, which in turn makes complex circuit designs more easily routable and saves computing time.

SUMMARY

This specification discloses systems and methods that may be employed in the design of integrated circuits (ICs), including, for example, in connection with electronic design automation (EDA) tools that include a wire routing module or similar functionality. In some embodiments, systems and methods may be implemented that allow an IC designer to design microprocessors, microcontrollers, memories, systems-on-a-chip (SoCs), application-specific integrated circuits (ASICs)—or any other type of digital or analog IC, as well as microelectromechanical systems (MEMS)—while reducing the IC's overall capacitance and its associated power consumption. Examples of electronic devices that may include one or more ICs designed using the techniques described herein include, but are not limited to, desktop computers, laptop computers, tablets, network appliances, mobile phones, personal digital assistants (PDAs), e-book readers, televisions, video game consoles, electronic control units, appliances, or any other electronic devices.

In some embodiments, a method may include routing a wiring path between an output of a first circuit component and a virtual landing pad (VLP) that represents an input of a second circuit component. The VLP may be provided, for example, in the form of a first IC description or specification that defines a larger landing pad than the actual, physical pin, terminal, connector, or port that will ultimately be manufactured for the second circuit component. By using a VLP, a wire routing tool can more easily find a connection path between the first and second circuit components that satisfies one or more design constraints (e.g., signal timing, etc.).

Moreover, use of the VLP by the wire routing tool may result in the output of the first circuit component being routed to an area that is not connected to the actual, planned terminal of the second circuit component (e.g., a non-conductive portion of the semiconductor substrate). Accordingly, the method may further include identifying the connection point and, in response to the connection point being separated from the actual terminal, completing the path from the connection point to the actual terminal. These operations may include using a second IC description or specification that defines the input of the second circuit component only as its actual, physical pin, instead of the larger VLP. After the path is completed, the method may further include, for example, verifying that the completed path (i.e., from the output of the first circuit component to the connection point and then to the actual terminal) still satisfies design constraints.

In some embodiments, a routing software tool or module may be provided. The routing tool may be a standalone executable program or a part of a larger EDA software package. In some cases, the routing tool may receive manual commands from a user that allow it to perform one or more of the methods described herein. In other cases, the routing tool may be configured to perform "autorouting" such that at least a portion of an IC's connections is routed without human intervention.

BRIEF DESCRIPTION OF THE DRAWINGS

The following detailed description makes reference to the accompanying drawings, which are now briefly described.

Figure 1:
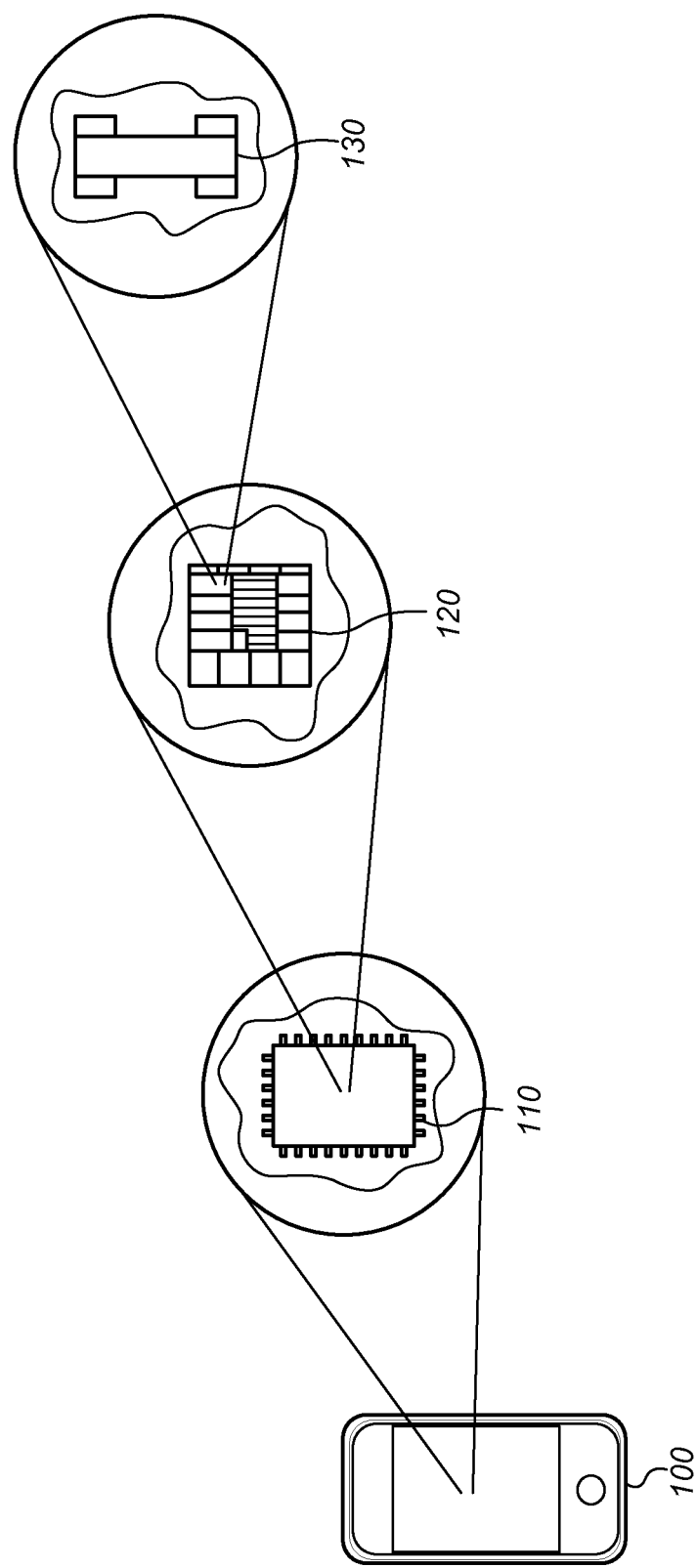
FIG. 1 is a diagram of an IC component according to certain embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, ¶6 interpretation for that unit/circuit/component.

DETAILED DESCRIPTION OF EMBODIMENTS

Introduction

Turning to FIG. 1, a diagram of an electronic device with an integrated circuit designed according to certain embodiments is shown. As illustrated, device 100 includes at least one integrated circuit (IC) 110. Although shown as a mobile phone or portable device, device 100 may be in fact any electronic device including, but not limited to, a desktop computer, a laptop computer, a tablet computer, a network appliance, a personal digital assistant (PDA), an e-book reader, a television, a media player, a video game console, an electronic control unit, a household appliance, etc.

IC 110 may include variously interconnected sections 120. In some cases, IC 110 may be a processor, controller, memory, system-on-a-chip (SoC), application-specific integrated circuit (ASIC)—or any other type of digital or analog IC as well as microelectromechanical systems (MEMS). As such, sections 120 may include, for example, memory blocks, arithmetic logic units, registers, clock circuits, counters, interrupt control blocks, control units including various logic control functions, etc. Each of sections 120 may in turn include a very large number of components 130 that are built with transistors, resistors, capacitors, etc., and that, in operation, provide some desired functionality. In some cases, components 130 may include "standard cells" configured to provide a logic or storage functions (e.g., AND, OR, XOR, XNOR, inverter, flip-flop, latch, etc.). Generally, a standard cell may be a defined circuit block that may be instantiated multiple times in a larger circuit, and the corresponding timing, size, layout, and other parameters may be predefined. Thus, the characteristics of the standard cell are known and may be used for timing, placement, and other purposes.

Prior to the production of IC 110, the integrated circuit may be designed using one or more electronic design automation (EDA) tools or software modules. Modern EDA software includes a wide range of routines that facilitate the logic design, circuit design, and physical design of integrated circuits. During a logic design phase, logic operations may be defined to achieve the IC's desired functionality. In a circuit design phase, various circuit schematics may be produced to describe circuits used in the design. Among other things, the circuit schematics may include circuits for the standard cells. These circuits may be characterized in circuit simulations (e.g., Spice simulations) over various process, temperature, power supply, and load conditions to determine parameters such as timing parameters for the cells. The set of standard cells may be referred to as a standard cell library. The logic design may be synthesized in a synthesis EDA tool (with the standard cell library), producing a netlist of standard cell instances and interconnect between the standard cells that implements the logic design. Other circuit schematics may be generated for macros, custom circuits, etc. In a physical design phase, the netlists and various circuit schematics may be transformed into an integrated circuit layout. Such a layout may include geometric representations of shapes and structures corresponding to physical elements that will eventually be fabricated on a semiconductor material or the like by a semiconductor fabrication facility.

Typical operations in the physical design phase of IC 110 include placement and routing, among others. Placement is a process through which a software tool determines the location of a component or group of components on a semiconductor surface. Once these locations have been determined, a "wire routing" process then attempts to find a suitable path for each connection within the circuit. Due to the high levels of integration that may be present in IC 110 (e.g., very large-scale integration or "VLSI"), a router's task of finding suitable paths that connect the various circuit components while satisfying design requirements can be computationally expensive. To ameliorate this problem, wire routers may require that circuit components (e.g., standard cells, etc.) have their pins, terminals, connectors, or ports (which would otherwise be relatively small in size) designed as large or "expanded" "landing pads."

Figure 2:
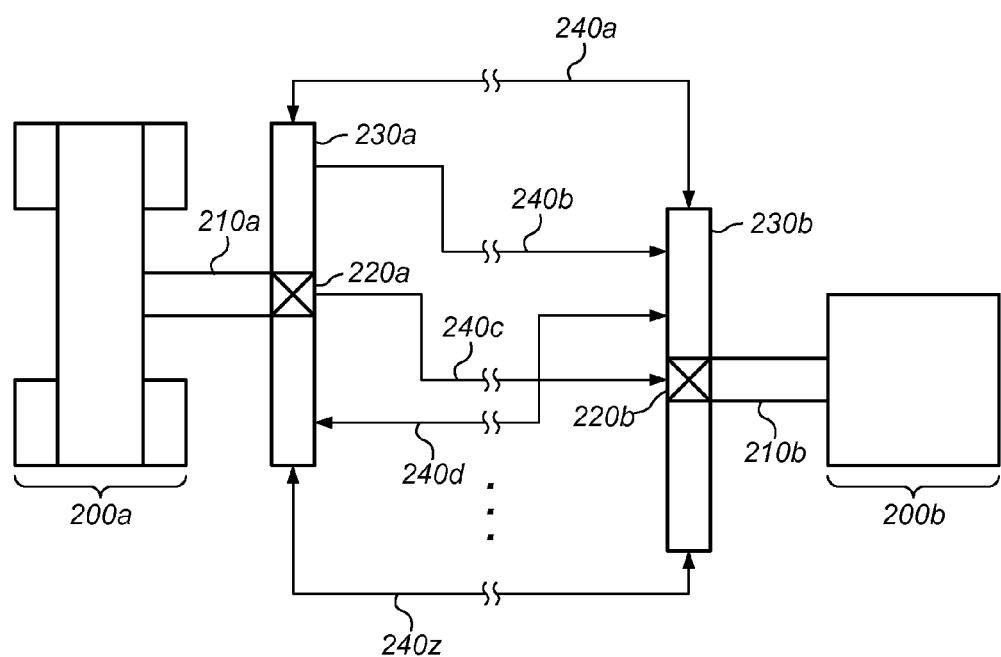
FIG. 2 is a diagram of connections between two IC components having enlarged, actual landing pads according to certain embodiments.

Referring to FIG. 2, a diagram of components with enlarged, actual landing pads are depicted according to some embodiments. Specifically, components 200*a* and 200*b* have been placed at specific locations on one or more layers of semiconductor material. As illustrated, component 200*a* represents a logic inverter and component 200*b* represents any standard or generic cell. Each of components 200*a* and 200*b* includes an input or output (210*a* and 210*b*, respectively) that provides a pin, terminal, connector, or port (220*a* and 220*b*, respectively) electrically coupled to a large landing pad (230*a* and 230*b*, respectively). In some cases, each of the geometries in FIG. 2 may be described in any other suitable form of IC description file (e.g., Library Exchange Format "LEF" or the like) for representing physical layout information of IC components.

Generally speaking, the main function of a wire router module or tool is to design wiring connections among components such that all terminals assigned to the same "net" are connected, and that terminals assigned to different nets are not connected. In the example in FIG. 2, the wire router may be tasked with finding a suitable connection path between terminals 230*a* and 230*b* of components 200*a* and 200*b*. To that end, the routing tool may evaluate one or more possible connections 240*a-z*. The selection of a specific connection among 240*a-z* may depend upon determinations of whether certain design rules such as timing (or delay), crosstalk, density, antenna requirements, etc. are satisfied by that connection. These design rules may vary depending upon the location (e.g., layer) of components 200*a* and 200*b* within the IC.

Typically, the wire router module may specify that pads are a number of routing tracks wide, which indicates the number of "wires" that can potentially be connected to the pad. That is, each wiring track can carry one wire, and thus a landing pad that is multiple wiring tracks wide may be connected to by a wire in any of the wiring tracks. By using landing pads 230*a* and 230*b* that are wider and/or longer than terminals 220*a* and 220*b*, the wire router has more flexibility to make connections, which in turn makes complex circuit designs more easily routable and saves computing time.

However, the use of large landing pads may have certain drawbacks. Because typically all standard cells and components have their pin landing pads "enlarged," the additional amount of conductive material causes higher pin capacitance across the IC, which in turn leads to higher power dissipation and degraded timing. Even though the extra capacitance on a per pin per cell basis may be small, over the entire design of all standard cells and all pins in a typical IC, it can add up to a sizable amount. As a result, in some cases, the amount of power consumed by these landing pads may be 1-2% of the power budget of the entire IC. In other cases, the power consumed may be an even greater proportion of the power budget if, for instance, on there are relatively few routing layers and/or the IC design is dominated by short length routes. Additionally, the higher capacitance of large physical landing pads may lead to worse timing and performance characteristics (e.g., if the IC design has short routes) and may worsen the integrity of the power grid, which in turn may require the use of faster components and lead to a second order increase in power consumption.

Moreover, some of the landing pad material in a given instance of the cell, although useful in providing routing alternatives, may not be actually needed during operation of the circuit. For example, if the pads 230a-230b are connected via the connection 240b in FIG. 2, the portion of the pads 230a-230b below the pins 220a-220b (as illustrated in FIG. 2) are not needed. However, removing each extra piece of metal by post processing an already routed design would require characterizing a unique instance of each standard cell for each possible connection point on its landing pad. Particularly, for each standard cell, the number of unique instances to be characterized would be a multiple of the number of I/O pins and the number of tracks reserved for each pin. As a result, post-processing characterization efforts would increase exponentially.

Wire Routing Using Virtual Landing Pads (VLPs)

Systems and methods described in this section disclose the concept of a "virtual landing pad." In some cases, a virtual landing pad or VLP may eliminate or at least reduce a need for large physical landing pads without sacrificing routability and without incurring characterization overhead. In certain embodiments, some of the techniques described herein may provide improved routability and/or reduced compute time on the tool side, as well as improved circuit performance/timing and/or power integrity on the design side.

Figure 3:
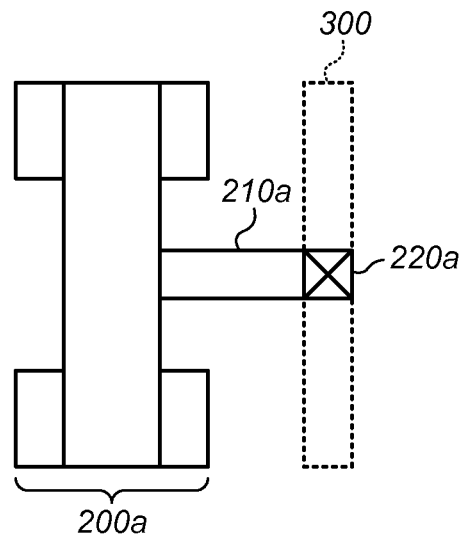
FIGS. 3-5 show examples of virtual landing pads (VLPs) according to certain embodiments.

Turning now to FIG. 3, diagrams of cells or components having one or more VLPs are depicted according to some embodiments. For sake of illustration, cell 210a is the same as depicted in FIG. 2. As shown in FIG. 3, cell 200a is described having VLP 300 that encompasses physical terminal 220a. Virtual landing pad 300 may be similar in size and location as actual landing pad 230a shown in FIG. 2, and may span as many routing tracks in width and/or length as required by the wire routing module or tool (or as required by methodology rules established by the designers of the IC 110). However, in contrast with actual landing pad 230a, VLP 300 may be provided only as a logical element that, while not intended to be actually fabricated on the IC (e.g., with a conductive or metallic material deposited on the semiconductor), for routing purposes additionally provides potential connection points. That is, VLP 300 may appear, to the routing tool, to be the actual landing pad. Meanwhile, physical pin 220a may be smaller than VLP 300. For example, in some embodiments, physical pin 220a may include a "via" from a lower level metal layer to a connecting router layer in a semiconductor material and the wiring 210a to the gate of cell 200a. The physical pin 220a may be the minimum permissible size for making a connection to a wiring layer, in one embodiment.

Figure 4:
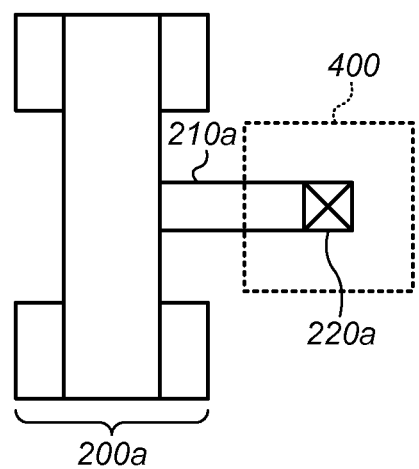
Figure 5:
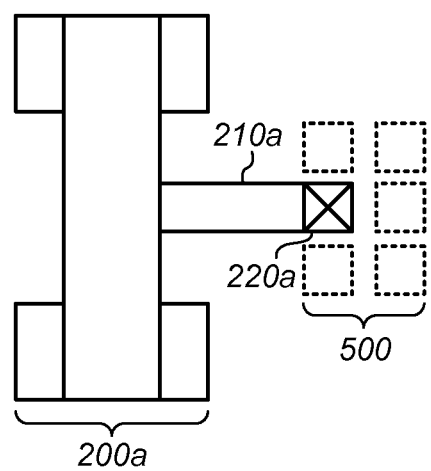
Figure 6:
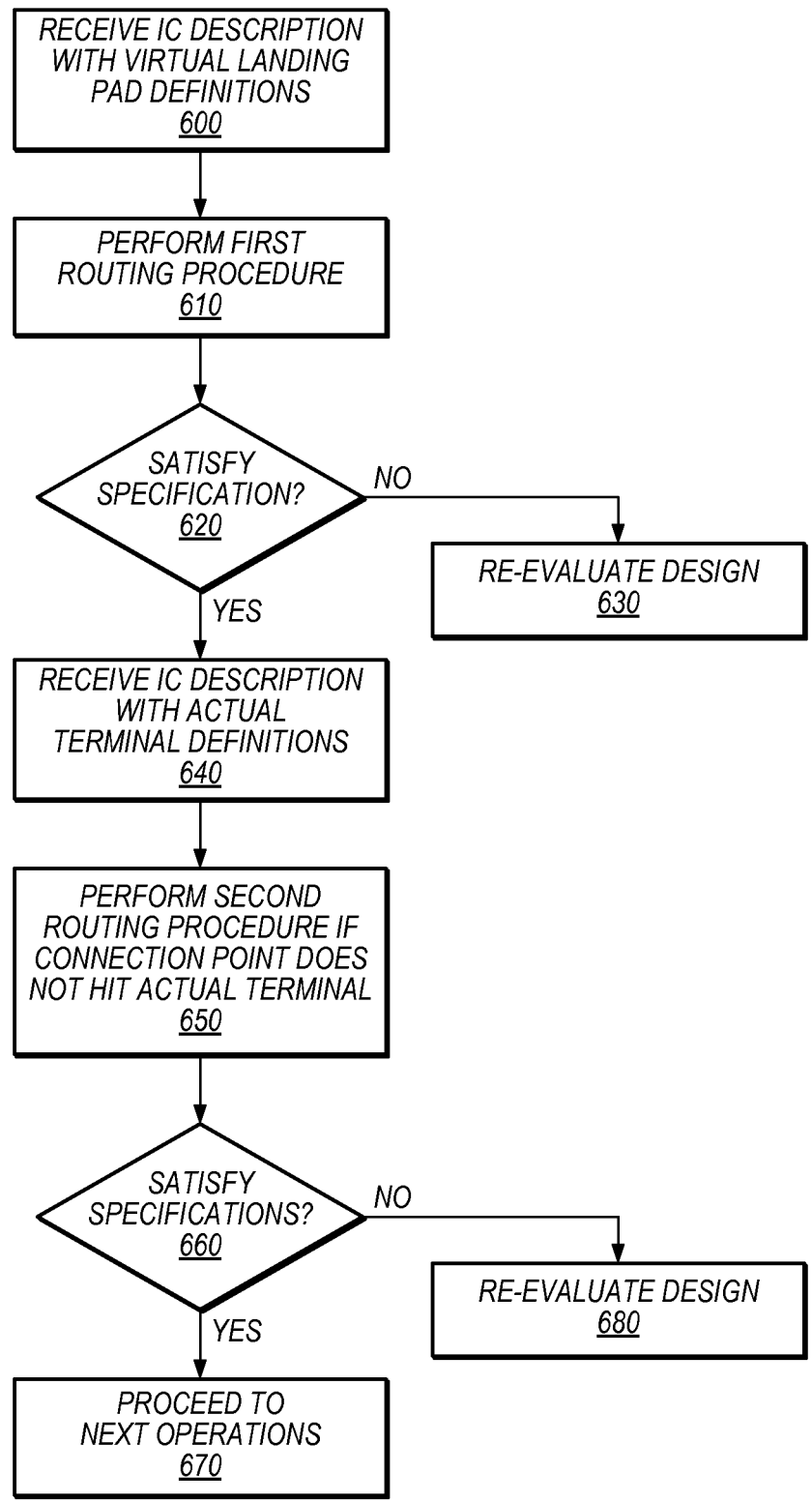
FIG. 6 is a flowchart of a method for wire routing using VLPs according to certain embodiments.

The diagram of FIG. 4 shows a square VLP 400 surrounding terminal 220a in part to illustrate that, in some embodiments, the shape of VLP 400 may be used-defined and is not limited to a specific geometry. In addition, the diagram of FIG. 5 shows a plurality of VLPs 320 located in proximity to terminal 220a in part to illustrate that, in some cases, VLP 500 may include one or more areas that do not contain terminal 220a and/or that are separated from each other. In the latter case, the wire routing tool or module may use one or more of VLPs 500 to find connections to or from component 200a.

In some embodiments, a standard cell or component such as component 200a may be a part of a component library. The cell library may include two or more sets of LEF files that represent physical layout information its components (e.g., coordinates, shapes, dimensions, etc.). For example, a first set may specify wide and/or long virtual landing pads for pins of certain (or all) components, and a second set may specify the actual physical landing pads for those components; which, in some cases, may be a minimum amount of metal or via. In other cases, the cell library may provide various sets of LEF files, each set having with a different amount or number of components described in different ways. For example, a first LEF file may describe all standard components having a certain type or size of VLP, a second LEF file may describe all or only some of those components with a different type or size of landing pads, and a third LEF file may describe only the actual terminals of those components.

Figure 7:
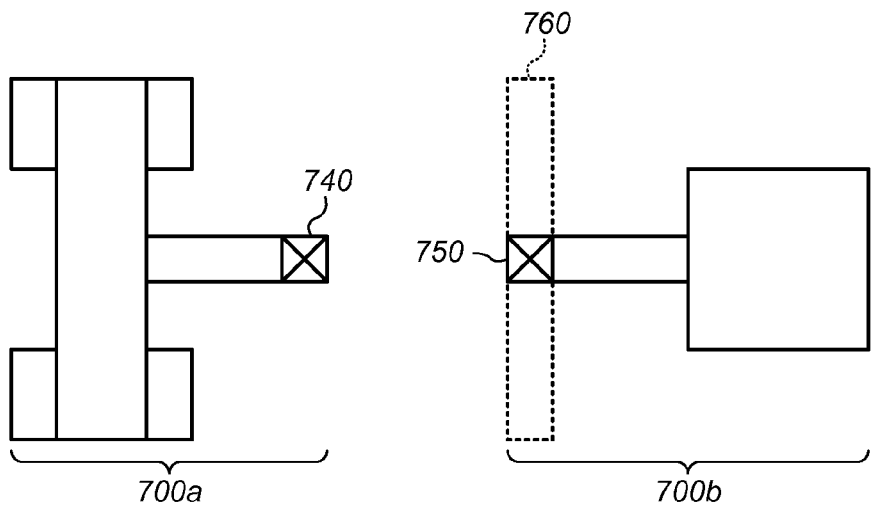
FIGS. 7-9 show diagrams illustrating the method of FIG. 4 according to certain embodiments.

Turning to FIGS. 6-9, a method for wire routing using VLPs and a diagram illustrating certain routing operations are depicted according to some embodiments. At 600, a routing module or tool may receive a first IC description file where standard cells or components definitions include VLPs having a number of specified routing tracks. Additionally, the routing module or tool may receive a layout in which the standard cells have been placed, but have not yet been connected together. In some embodiments, examples of IC description files may include LEF files or the like. As shown in FIG. 7, component 700a may include pin, terminal, connector, or port 740 (an input of component 700a) and component 700b may include pin, terminal, connector, or port 750 (an output of component 700b). As set forth in the first IC description file, the wire router's task may be to connect terminals 740 and 750 together. Because the first IC description file also defines VLP 760 surrounding actual terminal 750, however, the routing tool may have more flexibility in designing the desired connection than if VLP 760 were absent (in this case, because the area of VLP 760 is larger than the area of terminal 750). In fact, the routing tool may have as much flexibility in finding a suitable path between terminals 740 and 750 as if VLP 760 were an actual part of component 700b (shown, for example, as actual landing pad 230b in FIG. 2).

Figure 8:
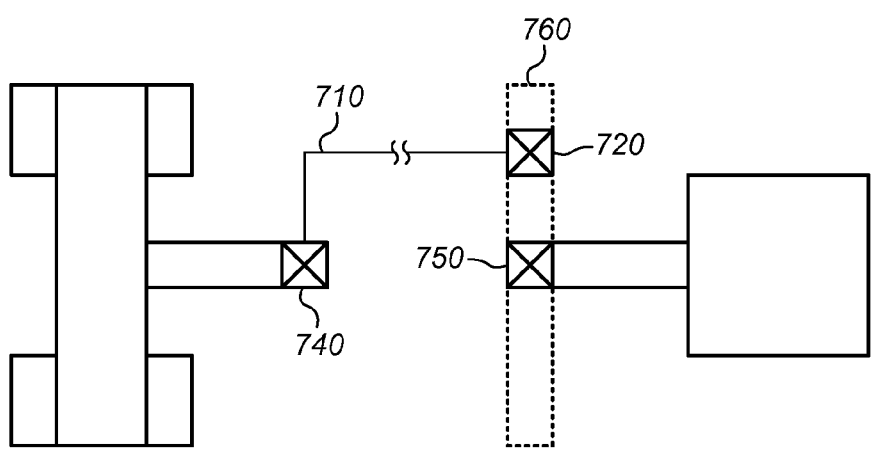

Still at 610, the routing tool may automatically select, for example, wiring path 710 between terminal 740 and connection point 720 (or any other intermediary point on the IC), as shown in FIG. 8. Because the first IC description indicates that connection point 720 is a part of VLP 760, for purposes of the routing process that occurs at 610, the routing tool may behave as if wiring path 710 were in fact connecting terminals 740 and 750. (In reality, however, connection point 520 may be a portion of non-conductive or non-metallic substrate that is not electrically coupled to terminal 750.) Then, at 620 the routing tool may determine whether wiring path 710 satisfies certain IC design specifications or parameters.

At 630, if wiring path 710 does not satisfy IC design specifications (e.g., timing, delay, crosstalk, density, etc.), the design may be reevaluated—e.g., the routing tool may attempt to select another path, components be placed in other locations or substituted for other components, etc. Once writing path 710 and/or other connections are determined to meet design parameters, at 640 the routing tool may receive a second IC description file (e.g., a second LEF file) with actual terminal definitions for components 700a and 700b.

Figure 9:
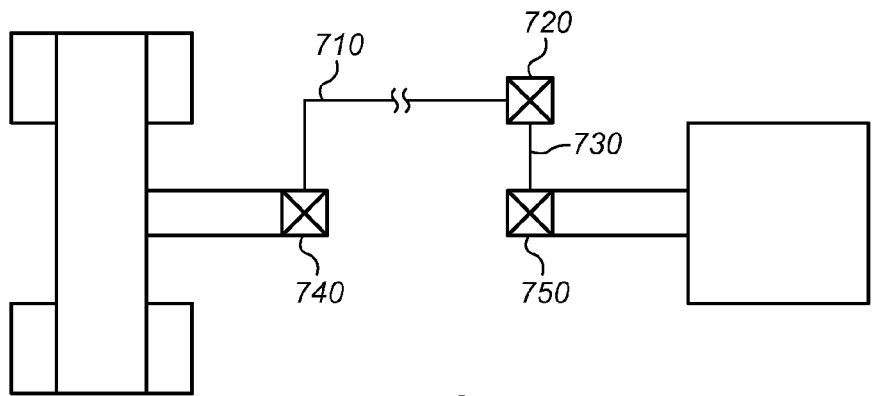

As noted above, connection point 720 may be electrically separated or isolated from actual terminal 750. Hence, at 650, the routing tool may complete the routing process by finding a second wiring path 730 between connection point 720 and actual terminal 750, as shown in FIG. 9. At 660, the routing tool may determine whether the entire connection (i.e., wiring paths 710 and 730 combined) satisfies the same (or different IC) design requirements. If so, at 670 the routing tool may proceed to perform additional operations and/or the routing phase of the IC design may be considered completed. Otherwise, at 680 the design may be reevaluated for validation or compliance with the parameters or requirements as previously described. In another embodiment, the connection of 730 may be inserted by a post-processing tool that is specifically coded to make the final connections from points on the VLP to the physical connection points. It is noted that, in alternative embodiment, the analysis of the design to determine if it meets specifications may only be performed after the second routing operation (e.g., at 660), and operations 660 and 680 may be eliminated in such cases.

Although the examples shown in FIGS. 6-9 describe the routing of one connection at a time for sake of illustration, in certain applications operations 610 and 620 may be performed for several (or all) terminals of various (or all) components in the IC simultaneously. Furthermore, as described above, the size and type of virtual landing pads may be user-defined and may vary per library component depending upon the application. In some embodiments, the routing tool or module may complete a routing operation using a certain size or type of virtual landing pad for one or more components, and then perform similar routing operations using different sizes and/or types of virtual landing pads, for example, to improve or optimize IC performance and/or to satisfy IC design requirements.

Figure 10:
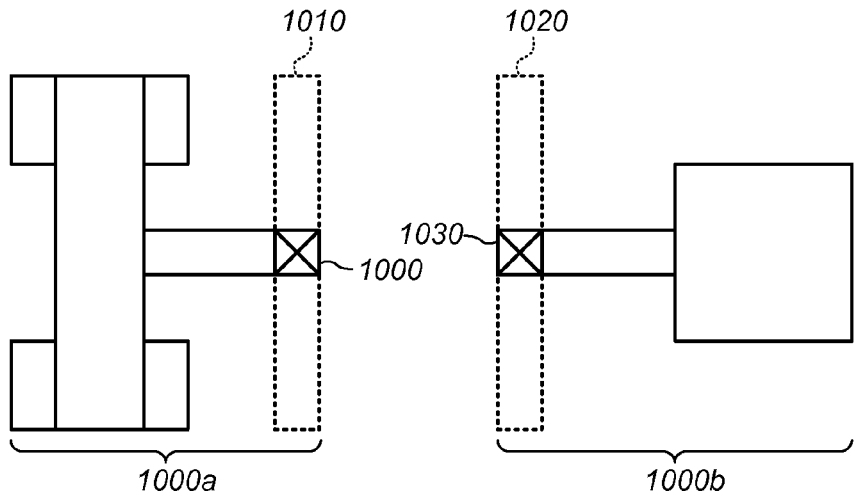
FIGS. 10-12 show additional diagrams illustrating the method of FIG. 4 according to certain embodiments.
Figure 11:
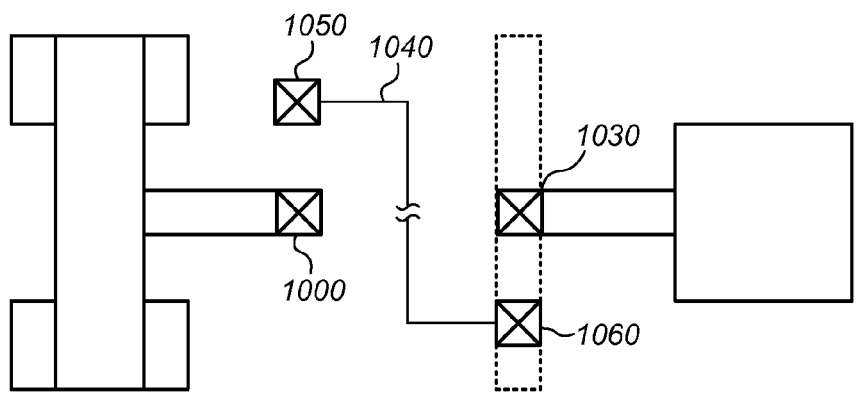
Figure 12:
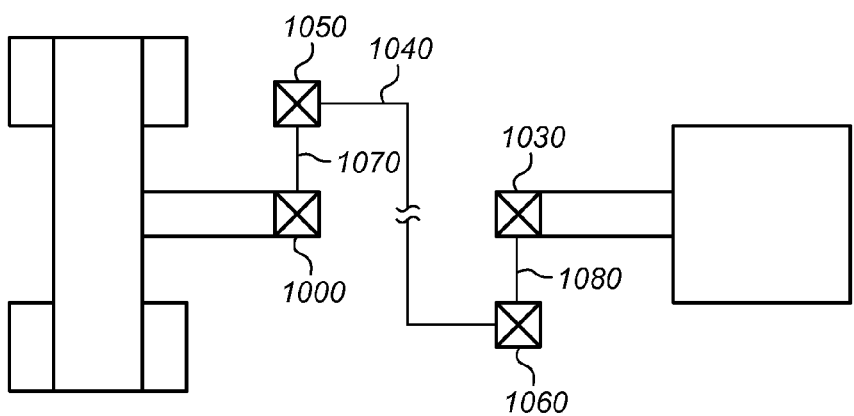

FIG. 10 illustrates another method for wire routing using VLPs according to some embodiments. As shown in the top diagram, both components 1000a and 1000b are described in a first IC description file as having VLPs 1010 and 1020, respectively. As such, at 610 in FIG. 6, the wire router may identify two connection points 1050 and 1060 connected via wire 1040 in a manner that satisfies IC specifications, as illustrated in FIG. 11. Yet, connections points 1050 and 1060 may be physically separate from their respective actual terminals 1000 and 1030, as described in a second IC description file received by the wire router at 640. Therefore, the wire routing module or tool may determine two additional connections 1070 (between connection point 1050 and terminal 1000) and 1080 (between connection point 1060 and terminal 1030), as depicted in FIG. 11.

Computer System and Storage Medium

In some embodiments, an EDA software package and/or a routing software tool or module may be provided that embodies the systems and methods described herein. In some cases, the routing tool may receive manual commands that allow it to perform one or more of the methods described herein. In other cases, the routing tool may be configured to perform "autorouting" such that at least a portion of an IC's connections is routed without human intervention.

Figure 13:
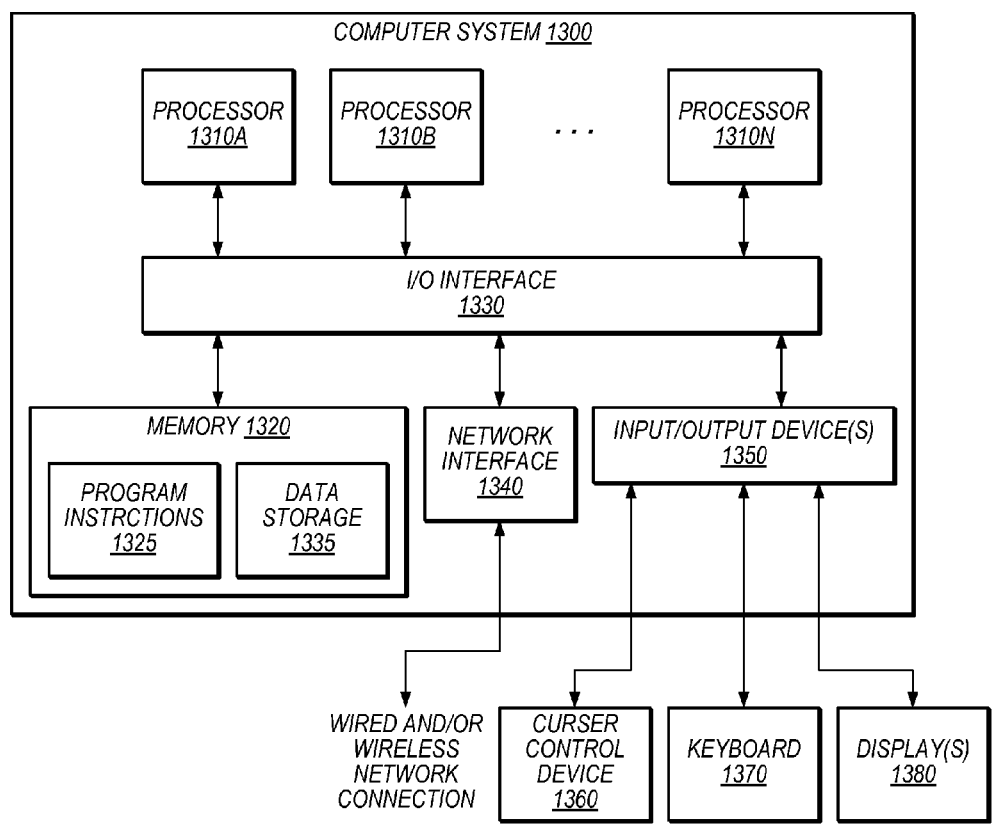
FIG. 13 is a block diagram of a computer system according to certain embodiments.

Embodiments of an EDA software tool and/or wire routing module as described herein may be executed on one or more computer systems, which may interact with various other devices. One such computer system is illustrated by FIG. 13. As illustrated, computer system 1300 includes one or more processors 1310 coupled to a system memory 1320 via an input/output (I/O) interface 1330. Computer system 1300 further includes a network interface 1340 coupled to I/O interface 1330, and one or more input/output devices 1350, such as cursor control device 1360, keyboard 1370, and display(s) 1380. It is contemplated that embodiments may be implemented using a single instance of computer system 1300, while in other embodiments multiple such systems, or multiple nodes making up computer system 1300, may be configured to host or execute different portions or instances of the wire routing module or EDA tool.

In various embodiments, computer system 1300 may be a single processor system including one processor 1310, or a multi-processor system including several processors 1310 (e.g., two, four, eight, or another suitable number). Processors 1310 may be any suitable processor capable of executing instructions. For example, in various embodiments, processors 1310 may be general-purpose or embedded processors implementing any of a variety of instruction set architectures (ISAs). In multiprocessor systems, each of processors 1310 may commonly, but not necessarily, implement the same ISA.

In some embodiments, at least one processor 1310 may be a graphics processing unit. A graphics processing unit or GPU may be considered a dedicated graphics-rendering device for a personal computer, workstation, game console or other computing or electronic device. For example, a graphics processor may implement a number of graphics primitive operations in a way that makes executing them much faster than drawing directly to the screen with a host central processing unit (CPU). In various embodiments, the wire routing method disclosed herein may, at least in part, be implemented by program instructions configured for execution on one of, or parallel execution on two or more of, such GPUs. The GPU(s) may implement one or more application programmer interfaces (APIs) that permit programmers to invoke the functionality of the GPU(s).

System memory 1320 may include program instructions 1325 and data storage 1335 that are accessible by processor 1310 and configured to implement embodiments of an EDA tool or wire routing module as described herein. In various embodiments, system memory 1320 may be implemented using any suitable memory technology, such as static random access memory (SRAM), synchronous dynamic RAM (SDRAM), nonvolatile/Flash-type memory, or any other type of memory.

In some embodiments, program instructions and/or data may be received, sent or stored upon different types of computer-accessible media or on similar media separate from system memory 1320 or computer system 1300. Generally speaking, a computer-readable storage medium may include any tangible storage or memory media such as magnetic or optical media, e.g., disk or DVD/CD-ROM, volatile or non-volatile media such as RAM (e.g., SDRAM, DDR, RDRAM, SRAM, etc.), ROM, etc. coupled to computer system 1300 via I/O interface 1330. Various embodiments may further include receiving, sending or storing instructions and/or data implemented in accordance with the foregoing description upon a computer-accessible medium. In these embodiments, the instructions and/or data may also be transmitted via transmission media or signals that are distinct from storage and memory media. For example, such signals may include electrical, electromagnetic, or digital signals, conveyed via a transmission or communication medium such as a wired network and/or a wireless link.

In an embodiment, I/O interface 1330 may be configured to coordinate I/O traffic between processor 1310, system memory 1320, and any peripheral devices in the device, including network interface 1340 or other peripheral interfaces, such as input/output devices 1350. In some embodiments, I/O interface 1330 may perform any necessary protocol, timing or other data transformations to convert data signals from one component (e.g., system memory 1320) into a format suitable for use by another component (e.g., processor 1310). In some embodiments, I/O interface 1330 may include support for devices attached through various types of peripheral buses, such as a variant of the Peripheral Component Interconnect (PCI) bus standard or the Universal Serial Bus (USB) standard, for example. In some embodiments, the function of I/O interface 1330 may be split into two or more separate components, such as a north bridge and a south bridge, for example. In addition, in some embodiments some or all of the functionality of I/O interface 1330, such as an interface to system memory 1320, may be incorporated directly into processor 1310.

Network interface 1340 may be configured to allow data to be exchanged between computer system 1300 and other devices attached to a network, such as other computer systems, or between nodes of computer system 1300. In various embodiments, network interface 1340 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1350 may, in some embodiments, include one or more display terminals, keyboards, keypads, touchpads, scanning devices, voice or optical recognition devices, or any other devices suitable for entering or retrieving data by one or more computer system 1300. Multiple input/output devices 1350 may be present in computer system 1300 or may be distributed on various nodes of computer system 1300. In some embodiments, similar input/output devices may be separate from computer system 1300 and may interact with one or more nodes of computer system 1300 through a wired or wireless connection, such as over network interface 1340.

As described above, systems and methods disclosed herein allow an IC designer or wire routing tool to retain the routing flexibility of wide/long physical pin landing pads without the cost of increased pin wire capacitance. A standard cell may be characterized with a minimum physical pin, not with the virtual pin. With such an approach, the routing may then be performed in as a two-stage process. First, the wire routing tool or module may route the entire design connecting to virtual pins. Second, the wire routing tool or module may complete the route to connect from the connection points of the virtual pins to the appropriate physical pins in another routing iteration or by some other automated method. The resultant complete route may be smaller, on average, than wire routes using wide/long physical landing pads. Additionally, because the wiring between the physical via (e.g., terminal 750 in FIGS. 7-9) and the original routing connection to the VLP (e.g., connection point 720) is not part of the component (e.g., standard cell 700*b*), no characterization is needed for the multiple connection points. Timing and other requirements may be handled as part of normal wiring layer processing.

Numerous variations and modifications will become apparent to those skilled in the art once the above disclosure is fully appreciated. It is intended that the following claims be interpreted to embrace all such variations and modifications.

The invention claimed is:

1. A method, comprising:
performing, by one or more computers,
receiving a description of a first circuit component and a description of a second circuit component, wherein the description of the second circuit component includes a virtual landing pad corresponding to an input of the second circuit component, and wherein the virtual landing pad includes an actual terminal of the second circuit component and one or more additional connection points that are adjacent to the actual terminal, wherein the actual terminal is at a predefined point on the second circuit component;
routing a wiring path between an output of the first circuit component and the virtual landing pad of the second circuit component responsive to the description of the second circuit component, wherein each of the actual terminal and the additional connection points are eligible to be connected to the wiring path during the routing;
identifying a first connection point on the virtual landing pad to which the wiring path is connected, wherein the first connection point is separated from the actual terminal of the second circuit component in a case in which the actual terminal is not the first connection point; and
completing the path between the first connection point and the actual terminal subsequent to routing the wiring path, wherein the additional connection points are non-conductive points of a semiconductor substrate prior to the routing and the completing.

2. The method of claim 1, wherein prior to the completing of the path, the first connection point is not electrically connected to the actual terminal.

3. The method of claim 2, wherein at least one of the first and second circuit components is a standard cell of an integrated circuit.

4. The method of claim 2, further comprising:
performing, by the one or more computers,
prior to the completing of the path, determining that the wiring path defined between the output of the first circuit component and the virtual landing pad satisfies a design rule for the integrated circuit.

5. The method of claim 4, wherein the design rule includes a timing requirement.

6. The method of claim 2, wherein the virtual landing pad includes an area larger than an area of the actual terminal of the second circuit component.

7. The method of claim 2, wherein identifying the first connection point comprises determining at least one coordinate of the connection point in an area of the second circuit component.

8. The method of claim 1, further comprising:
performing, by the one or more computers,
after completing the path between the first connection point and the actual terminal of the second circuit component, determining whether the completed path satisfies a design rule for the integrated circuit.

9. The method as recited in claim 1 wherein the actual terminal is a minimum-sized connection to the second circuit component according to a design rule for the integrated circuit.

10. The method as recited in claim 1 wherein each of the additional connection points that are not used in the routing and the completing exclude conductive material subsequent to the routing and the completing.

11. The method as recited in claim 1 wherein the routing comprises selecting one of the actual terminal or one of the additional connection points to an exclusion of other ones of the actual terminal and the additional connection points.

12. A non-transitory computer-readable storage medium having program instructions stored thereon that, in response to execution by one or more computers, cause the one or more computers to:
receive a description of a first circuit component and a description of a second circuit component, wherein the description of the second circuit component includes a virtual landing pad corresponding to an input of the second circuit component, and wherein the virtual landing pad includes an actual terminal of the second circuit component and one or more additional connection points that are adjacent to the actual terminal, wherein the actual terminal is at a predefined point on the second circuit component;

route a wiring path between an output of the first circuit component and the virtual landing pad of the second circuit component responsive to the description of the second circuit component, wherein each of the actual terminal and the additional connection points are eligible to be connected o the wiring path during the route;

identify a first connection point on the virtual landing pad to which the wiring path is connected, wherein the first connection point is separated from the actual terminal of the second circuit component in a case in which the actual terminal is not the first connection point; and complete the path between the first connection point and the actual terminal subsequent to routing the wiring path, wherein the additional connection points are non-conductive points of a semiconductor substrate prior to the routing and the completing.

13. The non-transitory computer-readable storage medium of claim 12, wherein prior to the completing of the path, the first connection point is not electrically connected to the actual terminal.

14. The non-transitory computer-readable storage medium of claim 13, wherein at least one of the first and second circuit components is a standard cell of an integrated circuit.

15. The non-transitory computer-readable storage medium of claim 13 wherein the program instructions, when executed by the one or more computers, further cause the one or more computers to:

prior to the completing the path, determine that the wiring path defined between the output of the first circuit component and the virtual landing pad satisfies a design rule for the integrated circuit.

16. The non-transitory computer-readable storage medium of claim 15, wherein the design rule includes a timing requirement.

17. The non-transitory computer-readable storage medium of claim 13, wherein the virtual landing pad includes an area larger than an area of the actual terminal of the second circuit component.

18. The non-transitory computer-readable storage medium of claim 13, wherein the program instructions which, when executed, cause the one or more computers to identify the first connection point include determining at least one coordinate of the connection point in an area of the second circuit component.

19. The non-transitory computer-readable storage medium of claim 12, wherein the program instructions, when executed by the one or more computers, further cause the one or more computers to:

after completing the path between the first connection point and the actual terminal of the second circuit component, determine whether the completed path satisfies a design rule for the integrated circuit.

20. The non-transitory computer-readable storage medium of claim 12 wherein the actual terminal is a minimum-sized connection to the second circuit component according to a design rule for the integrated circuit.

* * * * *